(12) United States Patent
Fujita

(10) Patent No.: US 7,936,529 B2
(45) Date of Patent: May 3, 2011

(54) TESTING APPARATUS FOR MAGNETIC RECORDING MEDIUM AND TESTING METHOD FOR MAGNETIC RECORDING MEDIUM

(75) Inventor: Junichi Fujita, Chiba (JP)

(73) Assignee: Showa Denko K.K., Tokyo (JP)

( * ) Notice: Subject to any disclaimer, the term of this patent is extended or adjusted under 35 U.S.C. 154(b) by 362 days.

(21) Appl. No.: 12/022,665

(22) Filed: Jan. 30, 2008

(65) Prior Publication Data

US 2008/0186020 A1 Aug. 7, 2008

(30) Foreign Application Priority Data

Feb. 2, 2007 (JP) .................................. 2007-024511

(51) Int. Cl.
*G11B 27/36* (2006.01)
(52) U.S. Cl. .......................................... 360/31; 360/53
(58) Field of Classification Search ........................ None
See application file for complete search history.

(56) References Cited

U.S. PATENT DOCUMENTS

| | | | | |
|---|---|---|---|---|
| 4,071,867 | A | * | 1/1978 | Pejcha ........................ 360/294.1 |
| 5,233,487 | A | * | 8/1993 | Christensen et al. ...... 360/77.04 |
| 6,130,793 | A | | 10/2000 | Ohmori et al. |
| 6,292,317 | B1 | * | 9/2001 | Alexander ...................... 360/31 |
| 7,064,539 | B2 | * | 6/2006 | Green et al. .................. 324/210 |
| 7,158,330 | B2 | * | 1/2007 | Morris et al. .................... 360/75 |
| 2003/0165033 | A1 | * | 9/2003 | Sasaki ........................ 360/265.9 |

FOREIGN PATENT DOCUMENTS

| | | |
|---|---|---|
| JP | 62-217466 A | 9/1987 |
| JP | 63-44187 A | 2/1988 |
| JP | 63-249978 A | 10/1988 |
| JP | 4-341923 A | 11/1992 |
| JP | 5-74098 A | 3/1993 |
| JP | 10-105908 | 4/1998 |
| JP | 2002-74868 A | 3/2002 |
| JP | 2003-257016 | 9/2003 |

* cited by examiner

*Primary Examiner* — Jason C Olson
(74) *Attorney, Agent, or Firm* — Sughrue Mion, PLLC

(57) ABSTRACT

A testing apparatus for magnetic recording medium and a testing method for magnetic recording medium is provided. Such a testing apparatus for magnetic recording medium, including: a rotary mechanism which causes synchronous, coaxial rotation of a master medium and a subject medium; a first support arm; a second support arm; a head stack assembly which causes synchronous movement of a first magnetic head and a second magnetic head by causing synchronous, coaxial rotation of the first support arm and second support arm, and which determines the position of the second magnetic head relative to the subject medium based on servo information signals obtained by loading servo information from the master medium into the first magnetic head; and a signal processing mechanism which synchronizes the servo information signals and magnetic recording playback signals, and which tests the magnetic recording playback signals of the subject medium.

2 Claims, 3 Drawing Sheets

TESTING APPARATUS FOR MAGNETIC RECORDING MEDIUM AND TESTING METHOD FOR MAGNETIC RECORDING MEDIUM

BACKGROUND OF THE INVENTION

1. Field of the Invention

The present invention relates to a testing apparatus for magnetic recording media, testing method for magnetic recording media, and production method for magnetic recording media including the testing method which are suited for use in defect testing as well as certify testing such as bit error rate testing, and parametric (electromagnetic conversion properties) testing pertaining to magnetic recording media used in hard disk drives and the like.

Priority is claimed on Japanese Patent Application No. 2007-24511, filed Feb. 2, 2007, the content of which is incorporated herein by reference.

2. Description of the Related Art

Magnetic recording devices typified by hard disk drives are widely used as external memory units of information processing devices such as computers, and in recent years have also come to be used as video recording devices for animated images.

Hard disk drives ordinarily include: a shaft wherein a discoid (donut-shaped) magnetic recording medium with an opening at the center is rotated alone or concentrically in a superimposed plurality (synchronous rotation is conducted in the case of a plurality); a motor which is joined via bearings to the pertinent shaft and which causes rotation of the magnetic recording medium; magnetic heads used for recording and/or playback on both faces of the magnetic recording medium; multiple support arms to which the pertinent heads are attached; and a head stack assembly which is capable of synchronously moving said multiple support arms, and which causes the magnetic heads to move to desired positions on the magnetic recording medium. Furthermore, the magnetic heads used for magnetic recording playback are ordinarily floating-type heads, and move at a fixed floating height on the magnetic recording medium.

Recording regions, which are called "tracks" in the radial direction and "sectors" in the circumferential direction, are formed on the magnetic recording medium. Reading and writing of information on the magnetic recording medium are conducted in track and sector units. A controlling magnetized pattern that serves to control the magnetic heads is formed on each track. The signals obtained from this controlling magnetized pattern are called servo signals. In the case where the intervals between information recording tracks of the magnetic recording medium are narrowed to increase the number of tracks, the servo signals are also correspondingly provided in a dense—that is, more numerous—manner in the radial direction of the disk, and it becomes necessary to enable conduct of precise control of the magnetic heads.

Magnetic recording media loaded into hard disk drives are manufactured by the following process. After conducting texturing treatment and the like on the surfaces of a substrate generally composed of aluminum alloy or glass or the like, the magnetic recording medium is prepared by sequentially forming a base layer, magnetic layer, protective layer, lubricating layer, etc. Subsequently, glide testing and certify testing are sequentially conducted on the obtained magnetic recording medium.

Glide testing is testing of whether or not protrusions exist on the surface of a magnetic recording medium. That is, when a magnetic recording medium undergoes recording playback with use of magnetic heads, if there exist protrusions with a height equal to or greater than the floating height (the interval between the medium and the magnetic head) on the surface of the magnetic recording medium, these will cause damage to magnetic heads as the magnetic heads strike the protrusions, and defects in the magnetic recording medium. In glide testing, a test is conducted as to whether or not protrusions of such height exist (e.g., see Patent Document 1, i.e. Japanese Unexamined Patent Application, First Publication No. H10-105908).

Certify testing is conducted on magnetic recording media which pass glide testing. In a manner similar to the recording and playback of an ordinary hard disk drive, certify testing records prescribed signals on a magnetic recording medium with a magnetic head, after which the signals are played back. The quality of the medium—e.g., electrical properties and existence or absence of defects pertaining to the magnetic recording medium—is then ascertained be detecting recording inabilities of the magnetic recording medium from the obtained playback signals (e.g., see Patent Document 2, i.e. Japanese Unexamined Patent Application, First Publication No. 2003-257016). Accordingly, certify testing confirms the ability to play back prescribed signals by magnetic head in a manner similar to the recording playback of a hard disk drive. Consequently, it is preferable prior to certify testing to conduct a test which detects recording inabilities of the magnetic recording medium by writing servo information signals into the magnetic recording medium using a device called a "servowriter" in a manner similar to the method of use of an actual hard disk drive.

However, to write servo signals into a magnetic recording medium generally requires 30 minutes to 2 hours of time per disk, depending also on the size of the magnetic recording medium. Accordingly, writing servo signals into magnetic recording media prior to certify testing causes a reduction in productivity with respect to magnetic recording media. Furthermore, due to the recent increase in demand for magnetic recording media, there is a need for certify testing apparatus capable of testing numerous magnetic recording media in a shorter time.

At the same time, the recording density of magnetic recording media has grown ever higher in recent years, and there is a need to conduct high-precision certify testing using test methods which are closer to the actual method of use of magnetic recording media in hard disk drives.

The present invention has been made in light of the aforementioned problems, and its object is to provide a testing apparatus for magnetic recording media and a testing method for magnetic recording media which enable the conduct of high-precision certify testing close to the actual method of use of magnetic recording media in hard disk drives in a short time.

SUMMARY OF THE INVENTION

As a result of diligent study with a view to solving the aforementioned problems, the present inventors discovered that it is possible to achieve high-precision certify testing close to the actual method of use of magnetic recording media in hard disk drives without writing servo information into the subject medium by configuring a testing method in which—while a discoid master medium which records servo information and a discoid subject medium are made to synchronously and coaxially rotate—a first magnetic head which reads said servo information from the master medium and a second magnetic head which conducts playback of the magnetic recording of the subject medium are synchronously moved relative to the surfaces of said master medium and said subject medium, and magnetic recording playback signals of the subject medium are tested using servo information signals from the master medium and magnetic recording playback signals from the subject medium, and thereby perfected the present invention. That is, the present invention pertains to the following.

(1) A testing apparatus for magnetic recording medium, including: a rotary mechanism which causes synchronous, coaxial rotation of a discoid master medium that records servo information and a discoid subject medium; a first support arm to the tip of which is attached a first magnetic head that reads said servo information from said master medium; a second support arm to the tip of which is attached a second magnetic head that conducts playback of the magnetic recording of said subject medium; a head stack assembly which causes synchronous movement of said first magnetic head and said second magnetic head by causing synchronous, coaxial rotation of said first support arm and said second support arm, and which determines the position of said second magnetic head relative to said subject medium based on servo information signals obtained by loading said servo information from said master medium into said first magnetic head; and a signal processing mechanism which synchronizes said servo information signals and magnetic recording playback signals that are generated by having said second magnetic head conduct magnetic recording playback of recording regions of said subject medium corresponding to said servo information signals, and which tests magnetic recording playback signals of said subject medium.

(2) The testing apparatus for magnetic recording medium according to (1), wherein said signal processing mechanism conducts alternate processing of said servo information signals and said magnetic recording playback signals.

(3) The testing apparatus for magnetic recording medium according to (1) or (2), wherein: said rotary mechanism causes a plurality of said subject media to undergo synchronous rotation that is coaxial with said master medium; a plurality of said second support arms is provided; said head stack assembly causes synchronous movement of said first magnetic head and a plurality of second magnetic heads respectively attached to said plurality of second support arms by causing synchronous, coaxial rotation of said first support arm and said plurality of said second support arms; and said signal processing mechanism tests magnetic recording playback signals of the respective subject Media.

(4) A testing method for magnetic recording medium, including: a positioning process which, while causing synchronous, coaxial rotation of a discoid master medium that records servo information and a discoid subject medium, causes synchronous movement of a first magnetic head that reads said servo information from said master medium and a second magnetic head that conducts playback of the magnetic recording of said subject medium relative to the surfaces of said master medium and said subject medium, and which determines the position of said second magnetic head relative to said subject medium based on servo information signals obtained by loading said servo information from said master medium into said first magnetic head; a signal generating process which generates magnetic recording playback signals by having said second magnetic head conduct magnetic recording playback of recording regions of said subject medium corresponding to said servo information signals; and a signal processing process which synchronizes said servo information signals and said magnetic recording playback signals by said signal processing mechanism, and which tests magnetic recording playback signals of said subject medium.

(5) A production method for magnetic recording medium, including the testing method for magnetic recording medium according to (4).

DETAILED DESCRIPTION OF THE INVENTION

A detailed description of the present invention is given below.

Figure 1:
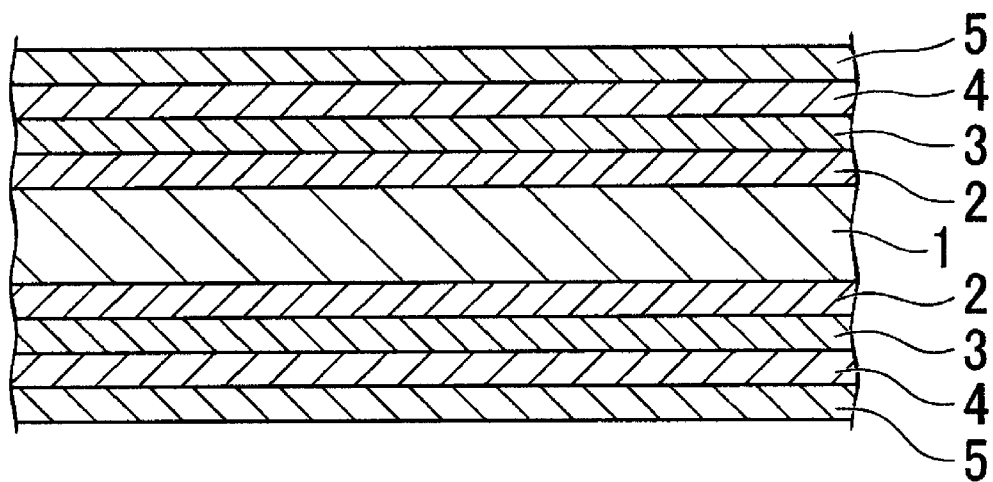
FIG. 1 is a sectional view showing one example of a magnetic recording medium subjected to certify testing using a certify testing apparatus that constitutes one example of the testing apparatus for magnetic recording media of the present invention.

FIG. 1 is a sectional view showing one example of a magnetic recording medium subjected to certify testing using a certify testing apparatus that constitutes one example of the testing apparatus for magnetic recording medium of the present invention. The magnetic recording medium shown in FIG. 1 is a discoid medium configured by sequential lamination of a non-magnetic base layer 2, magnetic layer 3, protective layer 4 and liquid lubricating layer 5 on both the topside and underside of a non-magnetic substrate 1. As the magnetic recording medium subjected to the testing of the present invention, in addition to the double-sided type of medium shown in FIG. 1, it is also acceptable to have a single-sided type where there is sequential lamination of a non-magnetic base layer, magnetic layer, protective layer and liquid lubricating layer on only one face of a non-magnetic substrate.

Prior to conducting certify testing on the magnetic recording medium shown in FIG. 1, it is preferable to conduct glide testing as shown below. In glide testing, a test head is made to float atop a magnetic recording medium which is made to rotate, and testing of whether or not protrusions exist on the surface of the magnetic recording medium is conducted with signals from the test head by having the test head scan the magnetic recording medium surface. By conducting the glide testing process prior to certify testing, it is possible to prevent damage to the test head in certify testing.

As a test head capable of use in glide testing, one may cite heads which have thermosensitive elements. In the case where heads having thermosensitive elements are used, when the test head contacts a protrusion existing on a magnetic recording medium being rotated at high speed, heat is momentarily generated by the test head, and the thermosensitive element detects the heat and outputs a signal, thereby enabling conduct of a glide test. It is preferable that the floating height of the test head in glide testing be lower than the floating height of the magnetic recording playback head ordinarily used in hard disk drives.

Figure 2:
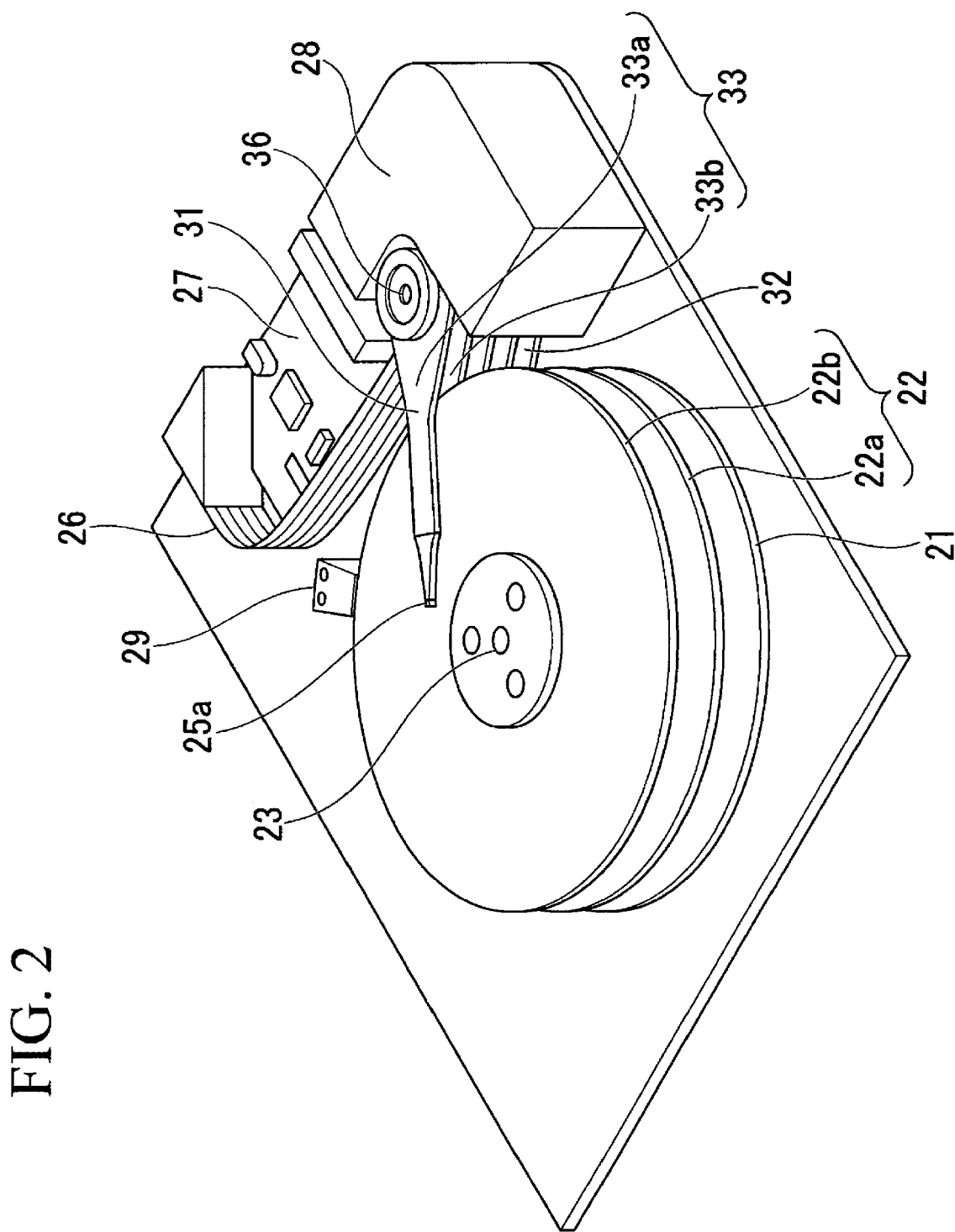
FIG. 2 is an oblique view which shows one example of the certify testing apparatus for magnetic recording media pertaining to the present invention.

Next, a description is given of the certify testing apparatus and certify testing method for magnetic recording media with reference to FIG. 2. FIG. 2 is an oblique view which shows one example of the certify testing apparatus for magnetic recording media pertaining to the present invention. In the present embodiment, the description concerns the case where certify testing is conducted on two subject media which are the magnetic recording medium shown in FIG. 1.

In FIG. 2, code number 21 indicates a master medium, and code number 22 indicates a subject medium. In the present embodiment, two subject media 22a and 22b are provided as the subject medium 22. The master medium 21 and subject media 22a and 22b are discoid in shape, and are composed from the magnetic recording medium shown in FIG. 1. In the master medium 21, servo information composed of track position information and sector position information is recorded in the recording regions corresponding to the respective positions. Moreover, the master medium 21 and subject media 22a and 22b are set up in overlapping positions from a planar perspective, and are synchronously and coaxially rotated by a rotary mechanism 23 provided with a spindle motor, as shown in FIG. 2.

As shown in FIG. 2, the master medium 21 is provided undermost in the spindle which causes rotation of the master medium 21 and subject media 22a and 22b, and the two subject media 22a and 22b are coaxially provided above the master medium 21. By providing the master medium 21 and subject media 22a and 22b in this manner, after completion of certify testing of the subject media 22a and 22b, it is possible to replace the subject media 22a and 22b for which testing has been completed with the subject media to next undergo certify testing without removing the master medium 21 from the certify testing apparatus.

Figure 3:
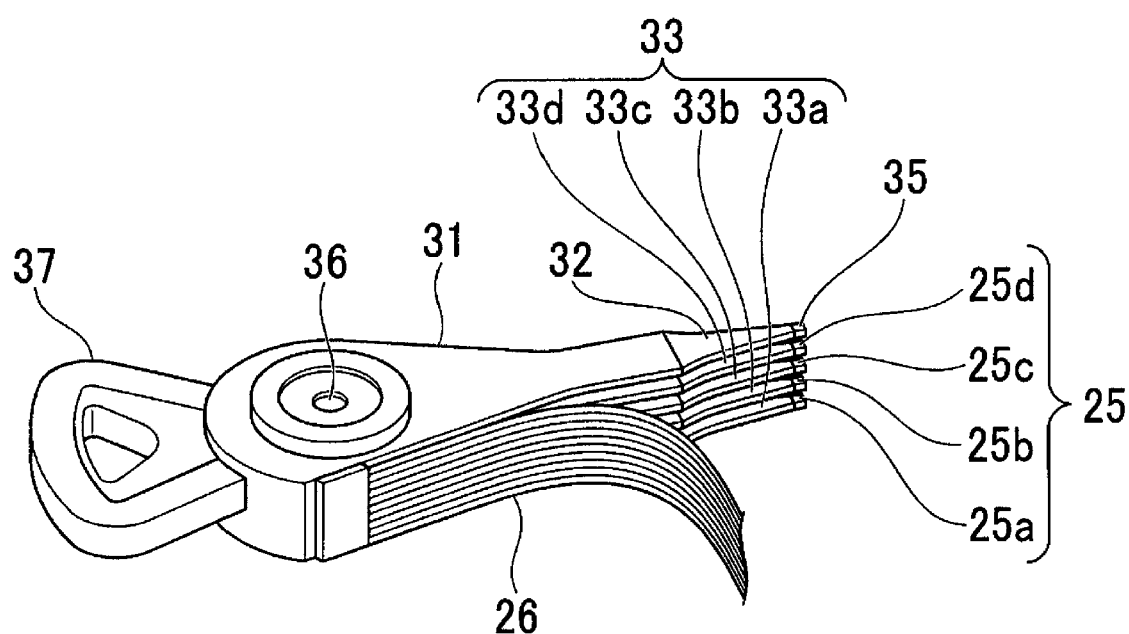
FIG. 3 is an oblique view which views the head stack assembly shown in FIG. 2 from the first support arm side.

In FIG. 2, code number 31 indicates a head stack assembly, code number 32 indicates a first support arm, and code number 33 indicates a second support arm. FIG. 3 is an oblique view which views the head stack assembly 31 shown in FIG. 2 from the first support arm 32 side.

With respect to the first support arm 32, a first magnetic head 35 which reads servo information from the master medium 21 is attached to the tip. In addition, with respect to the second support arm 33, a second magnetic head 25—which is provided at a position that overlaps with the first support arm 32 from a planar perspective on the upper side (lower side in FIG. 2) of the first support arm 32 and which conducts magnetic recording playback of the subject medium 22—is attached to the tip. In the present embodiment, four second support arms 33 (33a, 33b, 33c and 33d) are provided. As shown in FIG. 1, the second support arm 33a is capable of moving on the front face of the subject medium 22b, and the second support arm 33b is capable of moving on the rear face of the subject medium 22b. Moreover, the second support arm 33c is capable of moving on the front face of the subject medium 22a, and the second support arm 33d is capable of moving on the rear face of the subject medium 22a. Thus, by means of the second magnetic heads 25a, 25b, 25c and 25d attached to the respective tips of the four second support arms 33, it is possible to separately conduct magnetic recording playback of up to two subject media 22 (two in the present embodiment).

The first magnetic head 35 and the four second magnetic heads 25a, 25b, 25c and 25d are able to use heads suited to high recording density which not only have MR (magneto-resistance) elements that utilize huge magneto-resistance conversion effects as the playback element, but also TuMR elements or the like which utilize tunnel magneto-resistance conversion effects. Of the foregoing, high-precision certify testing is made possible by use of TuMR elements.

With the head stack assembly 31 shown in FIG. 3, the first support arm 32 and the four second support arms 33a, 33b, 33c and 33d are governed by a single pivot 36, and the first support arm 32 and four second support arms 33a, 33b, 33c and 33d are configured so as to coaxially rotate centering on the pivot 36. The rotation of the head stack assembly 31 centering on the pivot 36 is conducted by a coil 37. The coil 37 is driven by electric current which is controlled by a signal processing circuit 27 (signal processing mechanism) shown in FIG. 2.

Moreover, with the head stack assembly 31 shown in FIG. 3, the first magnetic head 35 and four second magnetic heads 25a, 25b, 25c and 25d are synchronously moved by the synchronous and coaxial rotation of the first support arm 32 and four second support arms 33a, 33b, 33c and 33d. Accordingly, in the present embodiment, there is synchronous conduct of the movement of the first magnetic head 35 on the surface of the master medium 21 shown in FIG. 2, the movement of the second magnetic head 25a on the front face of the subject medium 22b shown in FIG. 2, the movement of the second magnetic head 25b on the rear face of the subject medium 22b, the movement of the second magnetic head 25c on the front face of the subject medium 22a, and the movement of the second magnetic head 25d on the rear face of the subject medium 22a.

The signal processing circuit 27 (signal processing mechanism) shown in FIG. 2 synchronizes servo information signals and magnetic recording playback signals, and tests magnetic recording playback signals of the subject medium 22.

The servo information signals are obtained by loading servo information from the master medium 21 into the first magnetic head 35 by means of first head drive signals from the signal processing circuit 27. In the present embodiment, the magnetic recording playback signals are generated by having the second magnetic heads 25a, 25b, 25c and 25d conduct magnetic recording playback of recording regions of the subject media 22a and 22b corresponding to servo information signals by means of second head drive signals from the signal processing circuit 27. It is preferable that the signal processing circuit 27 conduct alternate processing of servo information signals and magnetic recording playback signals.

In addition, the signal processing circuit 27 is electrically connected to the first magnetic head 35 and second magnetic heads 25 by a flexible print substrate 26, enabling receipt and transmission of servo information signals from the first magnetic head 35, magnetic recording playback signals from the second magnetic heads 25, first head writing signals from the signal processing circuit 27, second head writing signals from the signal processing circuit 27, and so on. By this means, the first magnetic head 35 and the four second magnetic heads 25a, 25b, 25c and 25d are separately driven and controlled by signals from the signal processing circuit 27.

The signal processing circuit 27 is also electrically connected to a head drive unit 28 which causes rotation of the first support arm 32 and second support arm 33, and the rotation of the first support arm 32 and second support arm 32 centering on the pivot 36 is controlled by having the signal processing circuit 27 control the coil 37.

Accordingly, in the head stack assembly 31 of the present embodiment, the signal processing circuit 27 controls the coil 37, first magnetic head 35 and four second magnetic heads 25, and causes rotation of the first support arm 32 and four second support arms 33, whereby the first magnetic head 35 and four second magnetic heads 25 are synchronously moved, and the positions of the second magnetic heads 25a, 25b, 25c and 25d relative to the subject media 22a and 22b are determined based on servo information signals.

A retraction area 29 is provided in the certify testing apparatus shown in FIG. 2 for purposes of allowing retraction of the first magnetic head 35 and second magnetic heads 25 configuring the head stack assembly 31 during replacement of the subject media 22a and 22b. Accordingly, by moving the first magnetic head 35 and second magnetic heads 25 to the retraction area 29 during replacement of the subject media 22a and 22b, it is possible to prevent the first support arm 32 and second support arms 33 which configure the head stack assembly 31 from becoming an obstacle to replacement of the subject media.

As the retraction area 29 somewhat buffers the subject media, it is necessary to move the retraction area 29 together with the heads, and to separate the subject media and the retraction area during replacement of the subject media.

In the case where certify testing is conducted on two subject media using the certify testing apparatus for magnetic recording media shown in FIG. 2, the master medium 21 is first disposed undermost in the spindle, and the two subject media 22a and 22b are disposed above the master medium 21. Subsequently, while the master medium 21 and subject media 22a and 22b are synchronously and coaxially rotated at identical speed by the rotary mechanism 23, the servo information is loaded from the master medium 21 into the first magnetic head 35 by the first head drive signals from the signal processing circuit 27. Based on the obtained servo information signals, the first magnetic head 35 and second magnetic heads 25a, 25b, 25c and 25d are synchronously moved relative to the surfaces of the master medium 21 and subject media 22a and 22b, and the first magnetic head 35 is made to float on the surface of the master medium 21, the second magnetic head 25a on the front face of the subject medium 22b, the second magnetic head 25b on the rear face of the subject medium 22b, the second magnetic head 25c on the front face of the subject medium 22a, and the second magnetic head 25d on the rear face of the subject medium 22a, respectively (positioning process).

Next, magnetic recording playback signals are generated by having the second magnetic head 25a conduct magnetic recording playback of recording regions of the subject media 22b corresponding to the servo information signals by means of second head drive signals from the signal processing circuit 27 (signal generating process).

The servo information signals and magnetic recording playback signals obtained in this manner are sent to the signal processing circuit 27. The servo information signals and magnetic recording playback signals received by the signal processing circuit 27 are alternately processed by the signal processing circuit 27, are synchronized by the signal processing circuit 27, and the magnetic recording playback signals of the subject medium 22a are tested (signal processing process).

By testing magnetic recording playback signals by the signal processing circuit 27 in this manner, it is possible to conduct bit error rate testing of the subject medium 22b as well as certify testing such as parametric (electromagnetic conversion properties) testing and defect testing (testing of feasibility of use based on defects and scratches in the magnetic recording medium).

In this instance, as the subject medium 22b is of the double-sided type where magnetic layers are formed on both faces, testing is conducted on both the front and rear faces of the subject medium 22b. With respect to the testing apparatus shown in FIG. 2, the second magnetic head 25a is disposed on the front face side of the subject medium 22b, and the second magnetic head 25b is disposed on the rear face side of the subject medium 22b. Consequently, it is possible to continuously test both the front and rear faces of the subject medium 22b without inversing it.

In the present embodiment, the servo information signals are read prior to reading of the magnetic recording playback signals, but there are no particular limitations on the testing sequence of the two subject media 22a and 22b. For example, testing of the two subject media 22a and 22b may be conducted in the sequence shown below.

That is, servo information signals, magnetic recording playback signals of the front face of the subject medium 22b, servo information signals, magnetic recording playback signals of the rear face of the subject medium 22b, servo information signals, magnetic recording playback signals of the front face of the subject medium 22a, servo information signals, magnetic recording playback signals of the rear face of the subject medium 22a, servo information signals (of the next sector), magnetic recording playback signals of the front face of the subject medium 22b, servo information signals (of the next sector), magnetic recording playback signals of the rear face of the subject medium 22b, . . . .

By testing the two subject media 22a and 22b in such a sequence, compared to the case where all recording regions of the rear face of the subject medium 22b are tested after all recording regions of the front face of the subject medium 22b have been tested, after which testing of subject medium 22a is conducted in the same manner as that of subject medium 22b, it is possible to shorten the movement distance of the first magnetic head 35 and second magnetic heads 25 and to reduce the movement time of the first magnetic head 35 and second magnetic heads 25.

In the present embodiment, as it is possible to test two subject media with one testing apparatus, it is possible to cut down on the labor of replacing the subject media, and to reduce the number of testing apparatuses.

Subsequently, the first magnetic head 35 and second magnetic heads 25 are retracted to the retraction area 29, the subject media 22a and 22b are removed, and replaced with new subject media, and testing is conducted in the same manner described above.

As the testing apparatus for magnetic recording media of the present embodiment is provided with the rotary mechanism 23 which causes synchronous, coaxial rotation of the master medium 21 and subject media 22, the head stack assembly 31 which causes synchronous movement of the first magnetic head 35 and second magnetic heads 25, and which determines the position of the second magnetic heads 25 relative to the subject media 22 based on servo information signals obtained by loading servo information from the master medium 21 into the first magnetic head 35, and the signal processing circuit 27 which synchronizes the servo information signals and the magnetic recording playback signals that are obtained by having the second magnetic heads 25 conduct magnetic recording playback of recording regions of the subject media corresponding to the servo information signals, and which tests the magnetic recording playback signals of the subject media, the positioning of the second magnetic heads 25 relative to the recording regions on the subject media 22 where the magnetic recording playback signals are obtained can be controlled and conducted based on the servo signals of the master medium 21. Consequently, with the testing apparatus for magnetic recording media of the present embodiment, it is possible to achieve high-precision certify testing close to the actual method of use of magnetic recording media in hard disk drives.

Moreover, in the present embodiment, the servo information signals are signals that serve to control the positioning of the second magnetic heads 25 relative to the recording regions on the subject media 22 where the magnetic recording playback signals are obtained. Consequently, in the present embodiment, in the case where the signal processing circuit 27 conducts testing of magnetic recording playback signals obtained by having the second magnetic heads 25 conduct magnetic recording playback of recording regions of the subject media corresponding to servo information signals, there is no need to use servo information signals that have been written into the subject media in advance. That is, in the present embodiment, when magnetic recording playback signals from the subject media 22 are tested after the second magnetic heads 25 have been positioned in recording regions on the subject media 22 where the magnetic recording playback signals are obtained using servo information signals, there is no need to use servo information signals that have been written into the subject media in advance.

Accordingly, according to the testing apparatus for magnetic recording media of the present embodiment, it is possible to conduct certify testing without writing servo information into the subject media 22, and compared to the case where servo information is written into the subject media, it is possible to conduct the testing in a short time, thereby enabling marked improvement in the productivity pertaining to magnetic recording media.

In addition, with the testing apparatus for magnetic recording media of the present embodiment, as the master medium 21 is arranged undermost in the spindle, and as the subject media 22 are arranged above the master medium 21, it is possible to replace only the subject media, to repeatedly use the master medium 21, and to continuously conduct testing of numerous subject media, thereby enabling a marked increase in the throughput of certify testing.

As a method for conducting certify testing without writing servo information into the subject media, one may conceive of a method which adopts an inexpensive open control system such as a method where the heads are moved by a stepping motor, and positioning on the disks is mechanically conducted.

A closed control system is a system where position information read from the medium is fed back to a head drive mechanism to conduct positioning of the heads, while an open control system is a method where head positioning is conducted without use of such feedback of position information. With respect to positioning by stepping motor, positioning accuracy is poor due to influence sustained from the working accuracy of the mechanical structures such as ball screws and gears used in the stepping motor, loose gearing, and so on.

However, with a method adopting the open control system, it is difficult to accurately conduct positioning on an identical radius of the writing element and reading element of the head during writing rotation and during reading rotation of the subject medium. For this reason, with a method that adopts the open control system, it has been necessary to use a special dedicated head mounted on an extremely wide writing element so that reading can be conducted even when there is a major slippage in the radial position of the head during reading. The slippage amount in the positioning of the writing element and reading element of such a head—that is, the positioning accuracy of the head—varies according to the type and operational method of the device, but, for example, it is on the order of 0.5 μm to 1 μm with a testing method where tracks are arranged in concentric circles, and on the order of several tens of μm with a testing method where tracks are arranged in spirals. Accordingly, with methods adopting the open control system, one must use a head which has a writing width that compensates for the slippage amount in positioning. However, the heads currently used in hard disk drives have a writing width that is somewhat wider than reading width, and effective element width is also 0.2 μm or less. Consequently, with methods adopting the open control system, it has not been possible to easily use the heads that are used in hard disk drives.

In contrast, with the testing apparatus for magnetic recording media of the present embodiment, as positioning of the second magnetic heads 25 relative to the recording regions on the subject media 22 where magnetic recording playback signals are obtained can be controlled and conducted based on the servo signals of the master medium 21, it is possible to make use of the heads that are used in hard disk drives, and to achieve a high-precision certify testing close to the actual method of use of magnetic recording media in hard disk drives.

Moreover, with the testing apparatus for magnetic recording media of the present embodiment, the signal processing circuit 27 conducts alternate processing of servo information signals and magnetic recording playback signals.

Ordinarily, the head stack assembly used in hard disk drives has only one preamp which processes signals from multiple heads, with the result that the signals from multiple heads are processed by a single preamp by switching.

As the testing apparatus for magnetic recording media of the present embodiment is provided with a signal processing circuit 27 which synchronizes servo information signals obtained by loading into the first magnetic head 35 and magnetic recording playback signals obtained by having the second magnetic heads 25 conduct magnetic recording playback, and which tests magnetic recording playback signals of the subject media 22, it is possible to use as is the head stack assembly used in a hard disk drive as the head stack assembly 31 configuring the testing apparatus for magnetic recording media of the present embodiment.

In the case where the head stack assembly used in a hard disk drive is used as is as the head stack assembly 31 configuring the testing apparatus for magnetic recording media of the present embodiment, one obtains the effects that the testing apparatus is compact, that manufacturing can be conducted at low cost, and that high-precision certify testing can be achieved which is still closer to the actual method of use of magnetic recording media in hard disk drives.

In addition, according to the testing method for magnetic recording media of the present embodiment, as certify testing can be conducted without writing servo information into the subject media, compared to the case where servo information is written into the subject media, testing can be conducted in a short time, and the productivity pertaining to magnetic recording media can be markedly improved.

In the present embodiment, a description was given of the case where there are two subject media, but the testing apparatus and testing method for magnetic recording media of the present invention are not limited to the aforementioned case.

For example, it is acceptable to have just one subject medium, where the number of second magnetic heads provided in the head stack assembly 31 can be set to a discretionary number which is half or less.

Moreover, in the present embodiment, the number of second magnetic heads was set to four, but one may set a discretionary number so long as it is a number enabling stable coaxial and synchronous rotation of the first magnetic head and all the second magnetic heads which are provided in the head stack assembly 31.

EXAMPLES

A working example is presented below to describe the present invention in detail, but the present invention is not limited thereby.

Example

The magnetic recording media shown in Table 1 were manufactured, and glide testing and certify testing was conducted on the magnetic recording media.

Glide Testing

In glide testing, the mechanical spacing between the testing heads and the magnetic recording medium surface was set to 0.25 micro-inches, and the magnetic recording medium was deemed to be defective in the case where a signal was emitted from a testing head that was caused by collision with a protrusion on the surface of the magnetic recording medium, but was otherwise deemed to be acceptable.

Certify Testing

A magnetic recording medium that was deemed to be acceptable in glide testing was considered as a subject medium, and was subjected to the certify testing shown below. The certify testing was conducted using the testing apparatus shown in FIG. 2 and FIG. 3. As the first magnetic head and second magnetic head, TuMR heads employed in a 2.5" hard disk drive with 60-gigabyte capacity (1 unit) were used. As the master medium, in conformity with actual use of a magnetic recording medium in a hard disk drive, a medium was used wherein position information pertaining to 100,000 tracks per side and position information pertaining to 256 sectors per track circumference were recorded in the corresponding information of the single side. As the head stack assembly, a general-purpose head stack assembly employed in hard disk drives was used.

In certify testing, the master medium was first disposed undermost in the spindle, and a single subject medium was disposed above the master medium. Next, while the master medium and subject medium were coaxially and synchronously rotated at 5400 rpm, servo information was loaded from the master medium into the first magnetic head, the first magnetic head and second magnetic heads were synchronously moved relative to the surfaces of the master medium and subject medium based on the obtained servo information signals, the first magnetic head was made to float on the surface of the master medium, and the second magnetic heads were positioned and floated on the front face and rear face of the subject medium (positioning process).

Subsequently, magnetic recording playback signals were generated by having the second magnetic heads conduct magnetic recording playback of the recording regions of the subject medium corresponding to the servo information signals (signal generating process).

Next, the servo information signals and magnetic recording playback signals obtained in this manner were received by the signal processing circuit, the servo information signals and magnetic recording playback signals were alternately processed by the signal processing circuit 27, and synchronized by the signal processing circuit 27, and the magnetic recording playback signals of the subject medium were tested (signal processing process).

By this means, electromagnetic conversion properties testing and bit error rate testing of the pertinent recording regions (track and sector positions) of the front face of the subject medium were conducted in this sequence.

Subsequently, in the same manner as the aforementioned testing of the front face of the subject medium, electromagnetic conversion properties testing and bit error rate testing of the pertinent recording regions (track and sector positions) of the rear face of the subject medium were conducted in this sequence.

Thereafter, in the same manner as the aforementioned testing of the front face of the subject medium, defect testing of the recording regions (track and sector positions) over the entire surface of both faces of the subject medium was conducted.

By conducting such testing of the magnetic recording medium, it was possible in a convenient manner to achieve high-precision certify testing close to the actual method of use of magnetic recording media in hard disk drives.

With such certify testing of magnetic recording media, compared to systems where certify testing is conducted after servo information has been written into the entirety of subject medium in advance, it was found that throughput in the certify testing process was markedly increased.

Furthermore, as the head stack assembly, it was able to be confirmed that general-purpose head stack assemblies employed in hard disk drives can be used.

According to the testing apparatus and testing method for magnetic recording media of the present invention, it is possible to achieve high-precision certify testing which is close to the actual method of use of magnetic recording media in hard disk drives. Moreover, according to the testing apparatus and testing method for magnetic recording media of the present invention, certify testing is possible without writing servo information into the subject medium, with the result that testing can be conducted in a short time compared to the case where servo information is written into the subject medium, thereby enabling marked improvement in productivity pertaining to magnetic recording media. Furthermore, as the head stack assembly used in the hard disk drive can be used as is with the testing apparatus for magnetic recording media of the present invention, the testing apparatus can be manufactured at low cost and in a compact manner.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A testing method for magnetic recording medium, comprising:

a positioning process which, while causing synchronous, coaxial rotation of a discoid master medium that records servo information and a discoid subject medium, causes synchronous movement of a first magnetic head that reads said servo information from said master medium and a second magnetic head that conducts playback of the magnetic recording of said subject medium relative to the surfaces of said master medium and said subject medium, and which determines the position of said second magnetic head relative to said subject medium based on servo information signals obtained by loading said servo information from said master medium into said first magnetic head;

a signal generating process which generates magnetic recording playback signals by having said second magnetic head conduct magnetic recording playback of recording regions of said subject medium corresponding to said servo information signals;

a signal processing process which synchronizes said servo information signals and said magnetic recording playback signals by said signal processing mechanism, and which tests magnetic recording playback signals of said subject medium, and replacing the subject medium for which testing has been completed with another subject medium to undergo certify testing, without removing the master medium from a certify testing apparatus, while moving the first magnetic head and the second magnetic head to a retraction area during replacement of the subject media.

2. A production method for magnetic recording medium, comprising the testing method for magnetic recording medium according to claim 1.

* * * * *